(12) United States Patent
Bennett et al.

(10) Patent No.: US 7,365,584 B2
(45) Date of Patent: Apr. 29, 2008

(54) SLEW-RATE CONTROL APPARATUS AND METHODS FOR A POWER TRANSISTOR TO REDUCE VOLTAGE TRANSIENTS DURING INDUCTIVE FLYBACK

(75) Inventors: Paul T. Bennett, Phoenix, AZ (US);
Randall C. Gray, Tempe, AZ (US);
Matthew D. Thompson, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 39 days.

(21) Appl. No.: 11/445,652

(22) Filed: Jun. 2, 2006

(65) Prior Publication Data

US 2007/0279106 A1    Dec. 6, 2007

(51) Int. Cl.
*H03K 3/00* (2006.01)
(52) U.S. Cl. ...................... 327/170; 327/110
(58) Field of Classification Search ............... None
See application file for complete search history.

(56) References Cited

U.S. PATENT DOCUMENTS

| | | | | |
|---|---|---|---|---|
| 5,001,373 A | * | 3/1991 | Bator et al. ................. 327/321 |
| 5,608,595 A | * | 3/1997 | Gourab et al. ................. 361/79 |
| 5,920,224 A | * | 7/1999 | Preslar ........................ 327/326 |
| 6,078,204 A | * | 6/2000 | Cooper et al. ............... 327/309 |
| 6,400,106 B1 | | 6/2002 | Magruder | |
| 6,684,378 B2 | | 1/2004 | Yamamoto | |
| 6,956,425 B2 | * | 10/2005 | Adams ........................ 327/309 |
| 2003/0122594 A1 | * | 7/2003 | Tada ........................... 327/108 |
| 2005/0168168 A1 | | 8/2005 | Elliott | |

* cited by examiner

*Primary Examiner*—Cassandra Cox
(74) *Attorney, Agent, or Firm*—Ingrassia, Fisher & Lorenz, P.C.

(57) ABSTRACT

Apparatus and methods that reduce the amount of conducted/radiated emissions from a power switch (200) when a transistor (210) is switched OFF are disclosed. In addition, apparatus and methods that reduce the slew rate in a power switch when the power switch is switched off are disclosed. The apparatus comprises a transistor (210) including an inductive load (230) coupled to the transistor, a plurality of current sources (222, 224) coupled to the gate of the transistor, and a clamp (250) coupled to either the gate and the drain of the transistor, or to the gate and to ground depending on the location of the inductive load, wherein the clamp comprises a resistive element (260) to increase the voltage of the clamp when current flows through the clamp, and wherein the increased voltage causes the apparatus to include a different slew rate.

16 Claims, 6 Drawing Sheets

SLEW-RATE CONTROL APPARATUS AND METHODS FOR A POWER TRANSISTOR TO REDUCE VOLTAGE TRANSIENTS DURING INDUCTIVE FLYBACK

FIELD OF THE INVENTION

The present invention generally relates to semiconductor devices, and more particularly relates to power switches.

BACKGROUND OF THE INVENTION

In a power switch, when the transistor driving the inductive load is switched off, the drain voltage of the transistor abruptly increases. This abrupt change in drain voltage often causes conducted or radiated emissions on the output wires leading to the inductive load. The conducted and/or radiated emissions often cause interference in other electronic devices coupled to or proximate to the power switch, which makes the overall system perform less desirably.

Accordingly, it is desirable to provide apparatus and methods that reduce the amount of conducted or radiated emissions from a power switch when the transistor is switched off. In addition, it is desirable to provide apparatus and methods that modify the transition times of voltage in a power switch when the transistor is switched off. Furthermore, other desirable features and characteristics of the present invention will become apparent from the subsequent description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description is merely illustrative in nature and is not intended to limit the scope or application of possible embodiments. Furthermore, there is no intention to be bound by any expressed or implied theory presented in the preceding technical field, background, brief summary, or the following detailed description.

Various embodiments may be described herein in terms of functional and/or logical block components and various processing steps. It should be appreciated that such block components may be realized by any number of hardware, software, and/or firmware components configured to perform the specified functions. For the sake of brevity, conventional techniques and systems related to semiconductor processing, packaging, and semiconductor devices are not treated in exhaustive detail herein.

Figure 1:
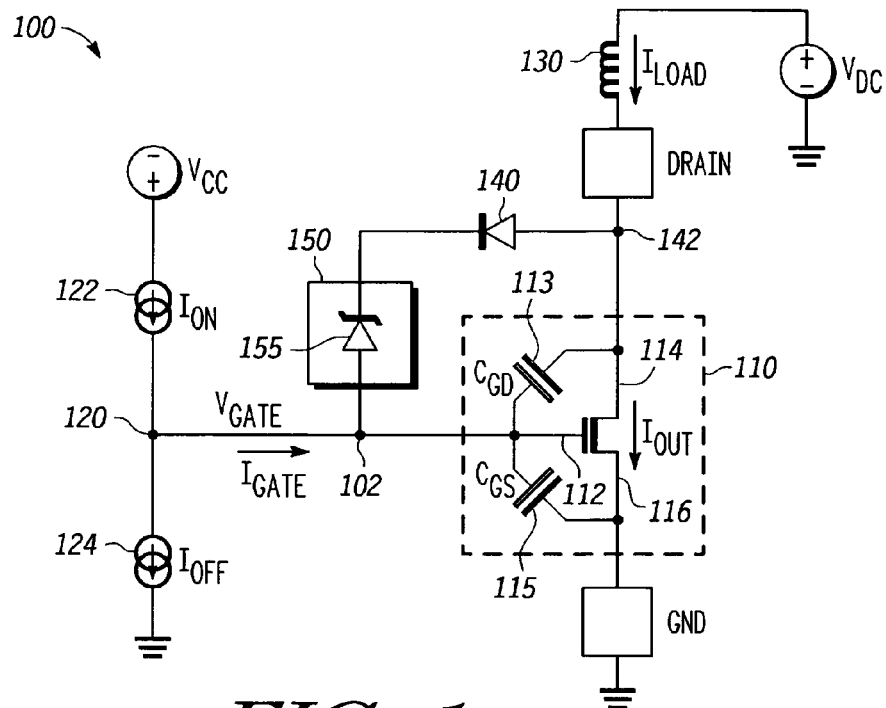
FIG. 1 is a diagram of a prior art power switch.

As discussed above, conventional power switches are unsatisfactory in a number of respects. With reference to FIG. 1A, for example, power switch 100 includes a transistor 110 having a gate 112, a drain 114, and a source 116. Furthermore, transistor 110 inherently includes a gate-drain capacitor ($C_{gd}$) 113 and a gate-source capacitor ($C_{gs}$) 115.

Gate 112 is coupled to a current source 122 and a current source 124 via a node 120. In addition, current source 122 is coupled to a voltage source Vcc, and current source 124 is coupled to ground.

Often, power switch 100 includes an inductive load 130 coupled in series with a supply voltage $V_{dc}$, wherein inductive load 130 is also coupled to drain 114. Furthermore, power switch 100 includes a diode 140 coupled to a drain node 142 and to a clamp 150, wherein clamp 150 is also coupled to a gate node 102. As shown, clamp 150 is a zener clamp comprising one or more zener diodes 155. In addition, power switch 100 also provides source 116 coupled to ground.

In operation, transistor 110 is switched "on" when current source 122 is switched on ($I_{on}$), which causes the gate voltage ($V_{gate}$) (i.e., the difference between the voltage potential at gate 112 and the voltage potential at source 116) to begin increasing from zero volts. When $V_{gate}$ reaches the threshold voltage ($V_{th}$) of transistor 110, the drain voltage ($V_{drain}$) begins decreasing, and until reaching zero volts, the gate current ($I_{gate}$) begins flowing to charge $C_{gd}$ 113 and $C_{gs}$ 115, wherein the slew rate of the drain voltage, $d(V_{drain})/dt$, is proportional to $I_{gate}/C_{gd}$. Furthermore, when $V_{drain}$ reaches zero volts, $V_{gate}$ begins increasing above $V_{th}$, which causes the output current ($I_{out}$) to begin flowing through inductive element 130 and transistor 110 via the drain-to-source path.

Transistor 110 is switched "off" by switching off current source 122 and switching "on" current source 124 ($I_{off}$). This causes $V_{gate}$ to begin to decrease. Once $V_{gate}$ decreases to $V_{th}$, $V_{drain}$ begins increasing as transistor 110 begins to switch off. Inductive element 130 continues to run load current ($I_{load}$) by forcing $V_{drain}$ above the supply voltage ($V_{dc}$) until it abruptly reaches its maximum voltage (i.e., the clamp threshold voltage), which holds $V_{gate}$ at $V_{th}$. This allows transistor 110 to run $I_{load}$ from inductive element 130 until decreasing to zero. When $V_{drain}$ is above $V_{dc}$, the current in inductive element 130 begins to decrease (i.e., $V_{inductor}=L(di/dt)$). Notably, when the voltage across inductive element 130 is reversed, the current decreases.

As $V_{drain}$ approaches the clamp threshold voltage, current in clamp 150 abruptly changes from running zero current to running $I_{gate}$. Moreover, as $V_{drain}$ approaches the maximum voltage, an abrupt change in $V_{drain}$ occurs at this point (i.e., abruptly changes from increasing in voltage to a substantially constant voltage). As noted above, these abrupt changes in voltage and current are what causes at least some conducted or radiated emissions that have the potential of interfering with other electronic devices.

Figure 2A:
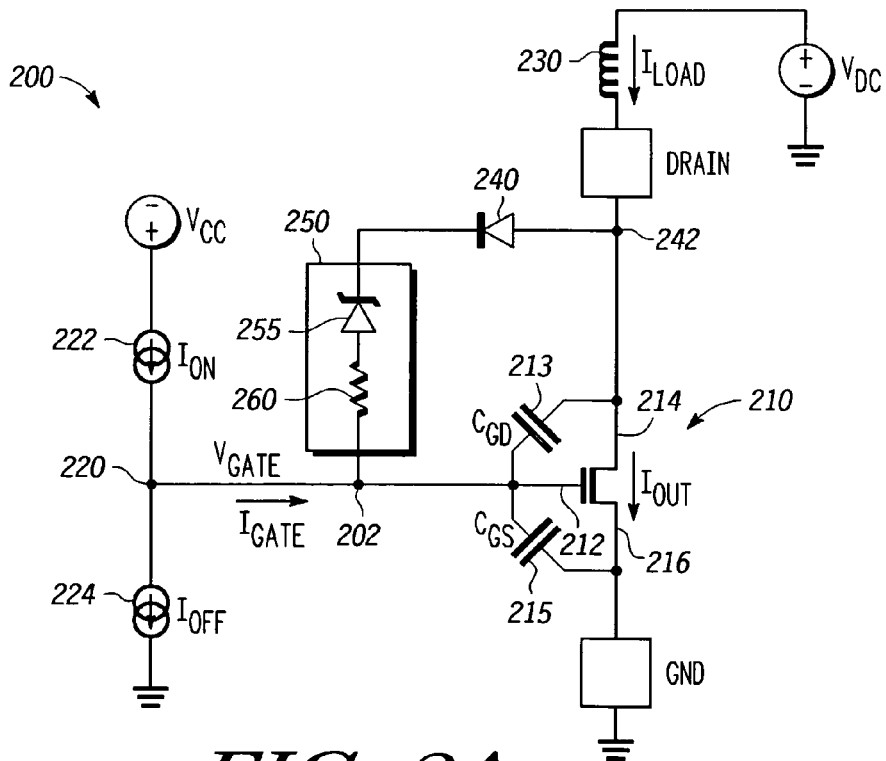
FIG. 2A is a diagram of one embodiment of a power switch with reduced conducted or radiated emissions.

With reference now to FIG. 2A, one exemplary embodiment of a power switch 200 with reduced conducted and/or radiated emissions is illustrated. Power switch 200, in one embodiment, includes a transistor 210 (e.g., a field effect transistor or the like) having a gate 212, a drain 214 (and inherently a gate-drain capacitor 213), and a source 216 (and inherently a gate-source capacitor 215).

In addition, power switch 200 includes a node 220 coupled to transistor 210 and coupled to current sources 222 and 224, wherein current sources 222 and 224 are substantially the same size so that transistor 210 may be properly switched on and off. Furthermore, power switch 200 includes a drain node 242 coupled to drain 214, an inductive element (e.g., an inductor) 230, and a diode 240. In various exemplary embodiments, inductive element 230 includes induction in the range of about 5 millihenries (mH) to about 100 mH. Furthermore, diode 240 is coupled to a clamp 250 including at least one zener diode 255, wherein clamp 250 is also coupled to a gate node 202. Zener diode 255 may be any zener diode or device known in the art or developed in the future capable of performing functions similar to a zener diode. Moreover, zener diode 255 may include any suitable voltage threshold ($V_{zth}$).

In accordance with one exemplary embodiment, clamp 250 includes a resistive element 260 coupled in series with zener diode 255. Resistive element 260, in one embodiment, is a resistor. In addition, various embodiments of switch 200 contemplate that resistive element 260 may be any hardware device capable of adding resistance to clamp 250.

In accordance with one exemplary embodiment, resistive element 260 includes a resistance in the range of about 5 kiloohms (kΩ) to about 100 kΩ. Notably, the resistance (R) of resistive element 260 is dependent upon a desired output voltage of clamp 250 and the pull down current of gate 212. In other words, according to the following formula:

$V_{clamp}=V_z+V_{gs}+V_{diode}+(I_{gate})(R)$, wherein $V_z$ is the voltage of zener diode(s) 255, $V_{gs}$ is the gate-source voltage, $V_{diode}$ is the voltage of diode 240, $I_{gate}$ is the pull down current supplied by current source 224, and R is the resistance of resistive element 260.

In operation, power switch 200 performs similarly to power switch 100 discussed above. However, the addition of resistive element 260 to clamp 250 reduces conducted or radiated emissions from power switch 200 by increasing the time it takes for $V_{drain}$ to transition from increasing to reaching its maximum voltage and/or the time it takes $I_{out}$ to transition from increasing to decreasing. Specifically, power switch 200 allows current to begin running in clamp 250 prior to $V_{drain}$ reaching the maximum voltage. Moreover, resistive element 260 begins to conduct current when the voltage rises to $V_z+V_{gs}+V_{diode}$. The maximum voltage is reached when $V_{drain}$ equals $V_z+V_{gs}+V_{diode}+(I_{gate})(R)$. The abrupt transition of $V_{drain}$ near the maximum voltage is softened (or rounded) by the addition of resistive element 260, thus reducing the conducted and/or radiated emissions due to this abrupt voltage change. In one exemplary embodiment of the invention, the transition (or slew rate) forms a function similar to a $\cos^2$ function.

Figure 2B:
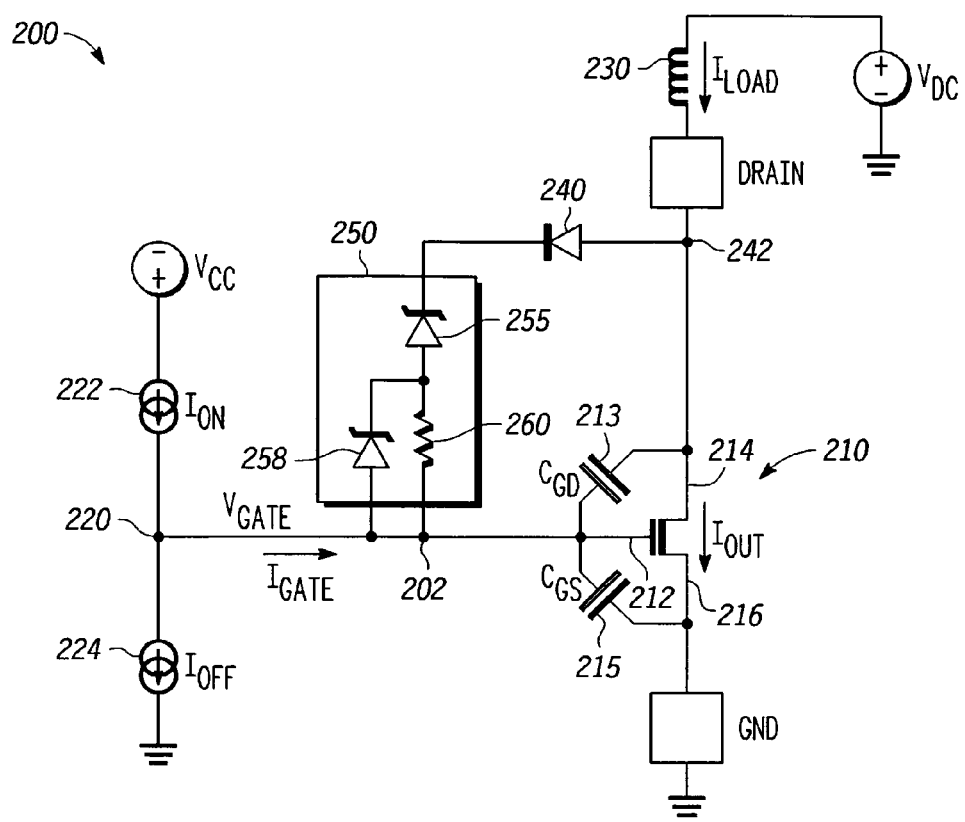
FIG. 2B is a diagram of the power switch in FIG. 2A with a protection circuit.

FIG. 2B is a diagram of an embodiment of power switch 200 having a protection circuit. In the embodiment illustrated in FIG. 2B, clamp 250 also includes an additional zener diode 258 coupled in parallel with resistive element 260.

Zener diode 258 may be any zener diode or device capable of performing the function of a zener diode known in the art or developed in the future. In one exemplary embodiment, zener diode 258 has a threshold voltage greater than the voltage of resistive element 260 such that damaging excessive current does not flow through resistive element 260 during, for example, a brief electrostatic discharge (ESD) pulse. Moreover, zener diode 258 allows enough $I_{gate}$ to run through clamp 250 when the output is subjected to a high current and/or high voltage transient event (e.g., an ESD pulse).

Figure 2C:
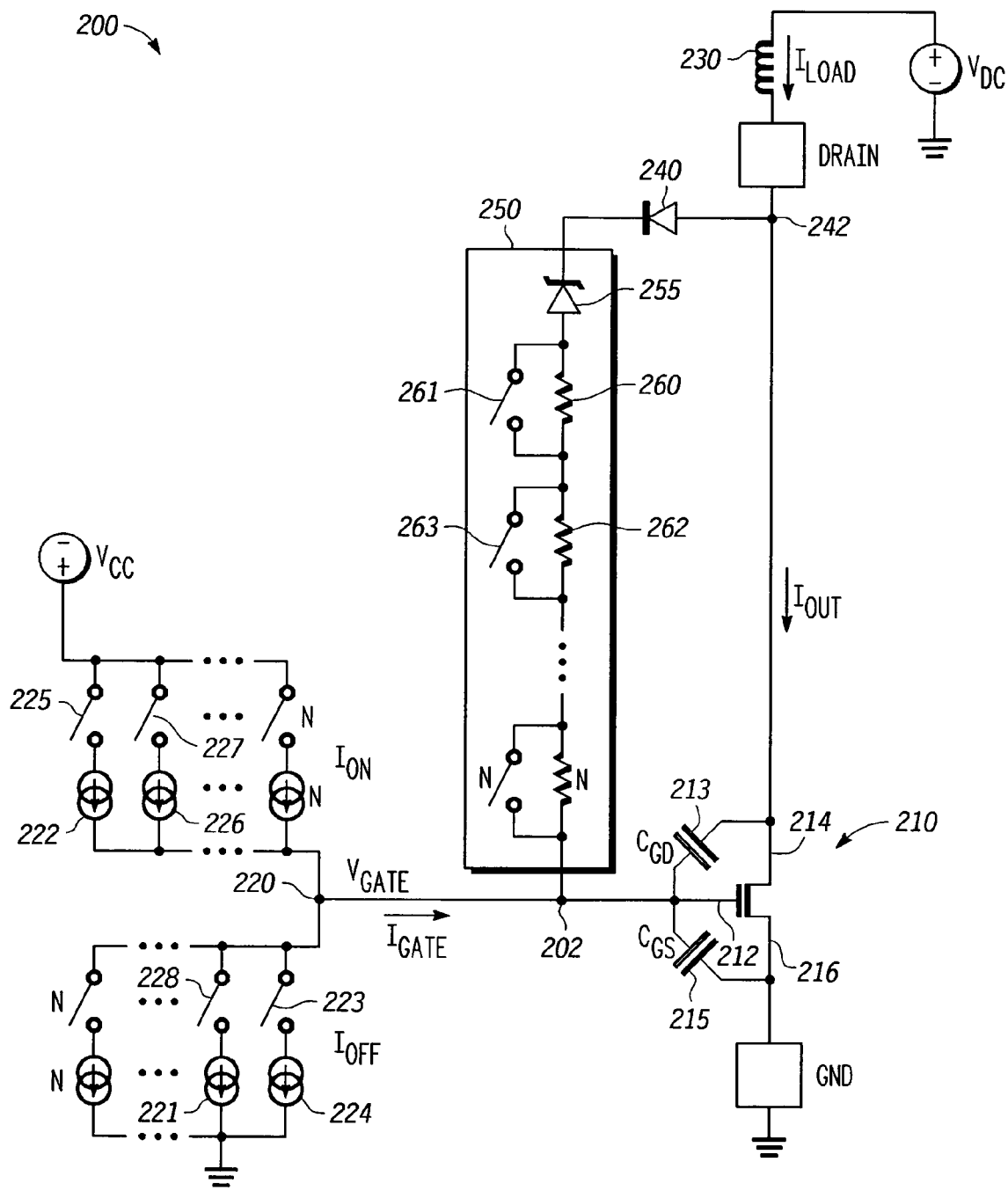
FIG. 2C is a diagram of one embodiment of the power switch of FIG. 2A including an adjustable slew rate.

FIG. 2C is a diagram of one embodiment of power switch 200 including an adjustable slew rate. In accordance with one exemplary embodiment, power switch 200 further comprises at least one additional current source 226 coupled in parallel with current source 222. Furthermore, a current source switch 227 is coupled to current source 226 such that when switch 227 is "on," additional current is supplied from current supply 226 to transistor 210, and when "off," additional current is not supplied to transistor 210. Furthermore, a current source switch 225 is coupled to current source 222 such that when switch 225 is "on," current supplied from current supply 224 may be switched on/off similar to switch 227. As such, switches 225 and 227 may each be any device known in the art or developed in the future capable of performing such switching functions. As illustrated in FIG. 2C, according to another embodiment, there can be up to N additional current sources and current source switches in parallel with current source 222 and current source switch 225, where N is an integer number selected according to the requirements of a given power switch implementation.

Furthermore, power switch 200 further comprises at least one additional current source 221 coupled in parallel with current source 224. In addition, each of current sources 221 and 224 includes a current source switch 228 and 223, respectively, coupled to it. In one exemplary embodiment, current source 224 is substantially the same size as current source 222, and current source 221 is substantially the same size as current source 226 so that transistor 210 may be properly switched off by current source 224 and/or 221 (utilizing switch 228 and/or 223, respectively) when current is supplied by current source 222 and/or 226 (utilizing switch 225 and/or 227, respectively), respectively. In other words, $I_{on}$ and $I_{off}$ are substantially the same amount of current. Notably, switches 228 and 223 may each be any device known in the art or developed in the future capable of performing such switching functions. Furthermore, as illustrated in FIG. 2C, according to another embodiment, there can be up to N additional current sources and current source switches in parallel with current source 224 and current source switch 223, where N is an integer number selected according to the requirements of a given power switch implementation.

In addition, clamp 250 comprises at least one additional resistive element 262 coupled in series with zener diode 255 and resistive element 260. Furthermore, a resistive element switch 261 and a resistive element switch 263 are coupled around resistive elements 260 and 262, respectively, such that when switch 261 is switched "on," current bypasses resistive element 260 and when switch 261 is switched "off," current flows through resistive element 260. Similarly, when switch 263 is switched "on," current bypasses resistive element 262 and when switch 263 is switched "off," current flows through resistive element 262. As such, switches 261 and 263 may each be any device known in the art or developed in the future capable of performing such switching functions. Accordingly, when additional current is supplied by current source 226 (i.e., when switch 227 is "on"), and switches 261 and 263 are "on," power switch 200 can have a different slew rate than the embodiment illustrated above in FIG. 2A. Furthermore, as illustrated in FIG. 2C, according to another embodiment, there can be up to N additional resistive elements (and corresponding resistive element switches) coupled in series with zener diode 255, where N is an integer number selected according to the requirements of a given power switch implementation.

Accordingly, power switch 200, in various embodiments, may include any number of additional current sources (and current source switches) of any size to provide any desired amount of current to transistor 210 (and properly switch off transistor 210), and may also include any number of additional resistive elements (and resistive element switches) to provide any amount of resistance to clamp 250 such that power switch 200 may include any number of desired slew rates. In accordance with one exemplary embodiment, power switch 200 includes three current sources and current source switches (i.e., $I_{on}$), three additional current sources and current source switches (i.e., $I_{off}$), and three resistive elements and resistive element switches such that power switch 200 includes, for example, a slow, a medium, and a fast slew rate.

Figure 3A:
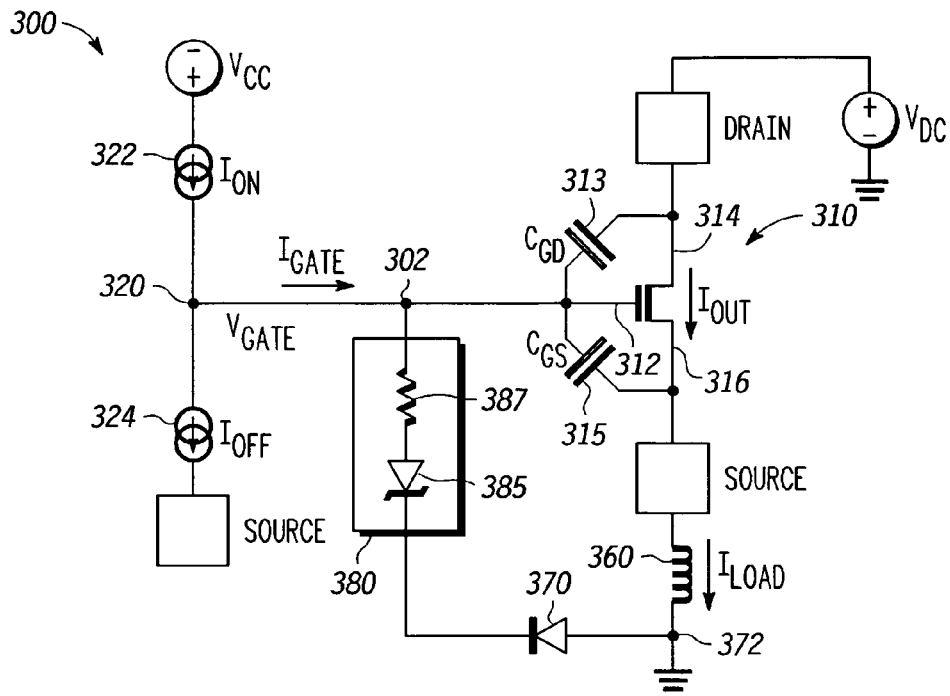
FIG. 3A is a diagram of another embodiment of a power switch with reduced conducted or radiated emissions.

With reference now to FIG. 3A, another embodiment of a power switch 300 is illustrated. Power switch 300, in one embodiment includes a transistor 310 having a gate 312, a drain 314 (and inherently a gate-drain capacitor 313), and a source 316 (and inherently a gate-source capacitor 315). In addition, power switch 300 includes a node 320, a gate node 302, and a current source 322 similar to node 220, gate node 202, and current source 222 discussed above, respectively. Furthermore, power switch 300 includes a current source 324 coupled to source, wherein current source 324 is substantially the same size as current source 322 so that transistor 310 may be properly switched on and off.

In addition, power switch 300 includes an inductive element 360 coupled to transistor 310 and a source node 372. In various exemplary embodiments, inductive element 360 includes induction in the range of about 5 mH to about 100 mH. Furthermore, source node 372 is coupled to a diode 370, and diode 370 is coupled to a clamp 380, wherein clamp 380 is also coupled to gate node 302. In one embodiment, clamp 380 is a zener clamp comprising at least one zener diode 385. Moreover, clamp 380, in one embodiment, includes a resistive element 387 coupled in series with zener diode 385.

In accordance with one exemplary embodiment, resistive element 387 includes a resistance in the range of about 5 kΩ to about 100 kmΩ. Notably, the resistance (R) of resistive element 387 is dependent upon a desired output voltage of clamp 380 and the pull down current of gate 312. In other words, according to the following formula:

$V_{clamp} = V_z + V_{gs} + V_{diode} + (I_{gate})(R)$, wherein $V_z$ is the voltage of zener diode(s) 385, $V_{gs}$ is the gate-source voltage, $V_{diode}$ is the voltage of diode 370, $I_{gate}$ is the pull down current supplied by current source 324, and R is the resistance of resistive element 387.

Figure 3B:
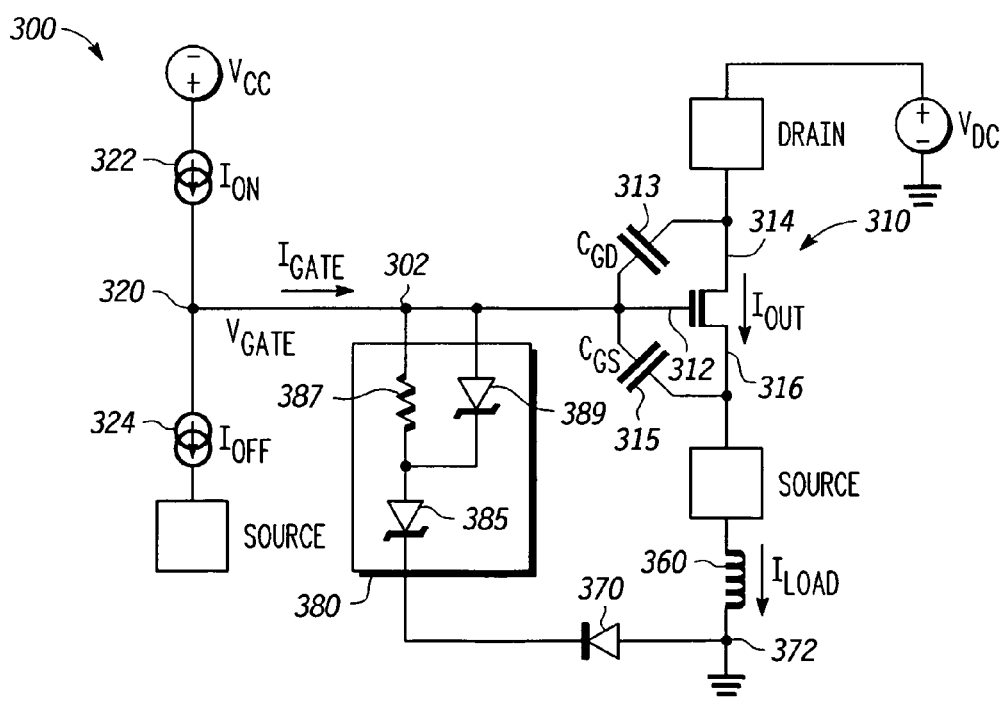
FIG. 3B is a diagram of the power switch in FIG. 3A with a protection circuit.

FIG. 3B is a diagram of power switch 300 with a protection circuit. In the embodiment illustrated in FIG. 3B, clamp 380 includes an additional zener diode 389 coupled in parallel with resistive element 387.

Zener diode 389 may be any zener diode or device capable of performing the function of a zener diode known in the art or developed in the future. In one exemplary embodiment, zener diode 389 includes a threshold voltage greater than the voltage of resistive element 387 such that damaging excessive current does not flow through resistive element 387 during, for example, a brief electrostatic discharge (ESD) pulse. Moreover, zener diode 389 allows enough $I_{gate}$ to run through clamp 380 when the output is subjected to a high current and/or high voltage transient event (e.g., an ESD pulse).

Figure 3C:
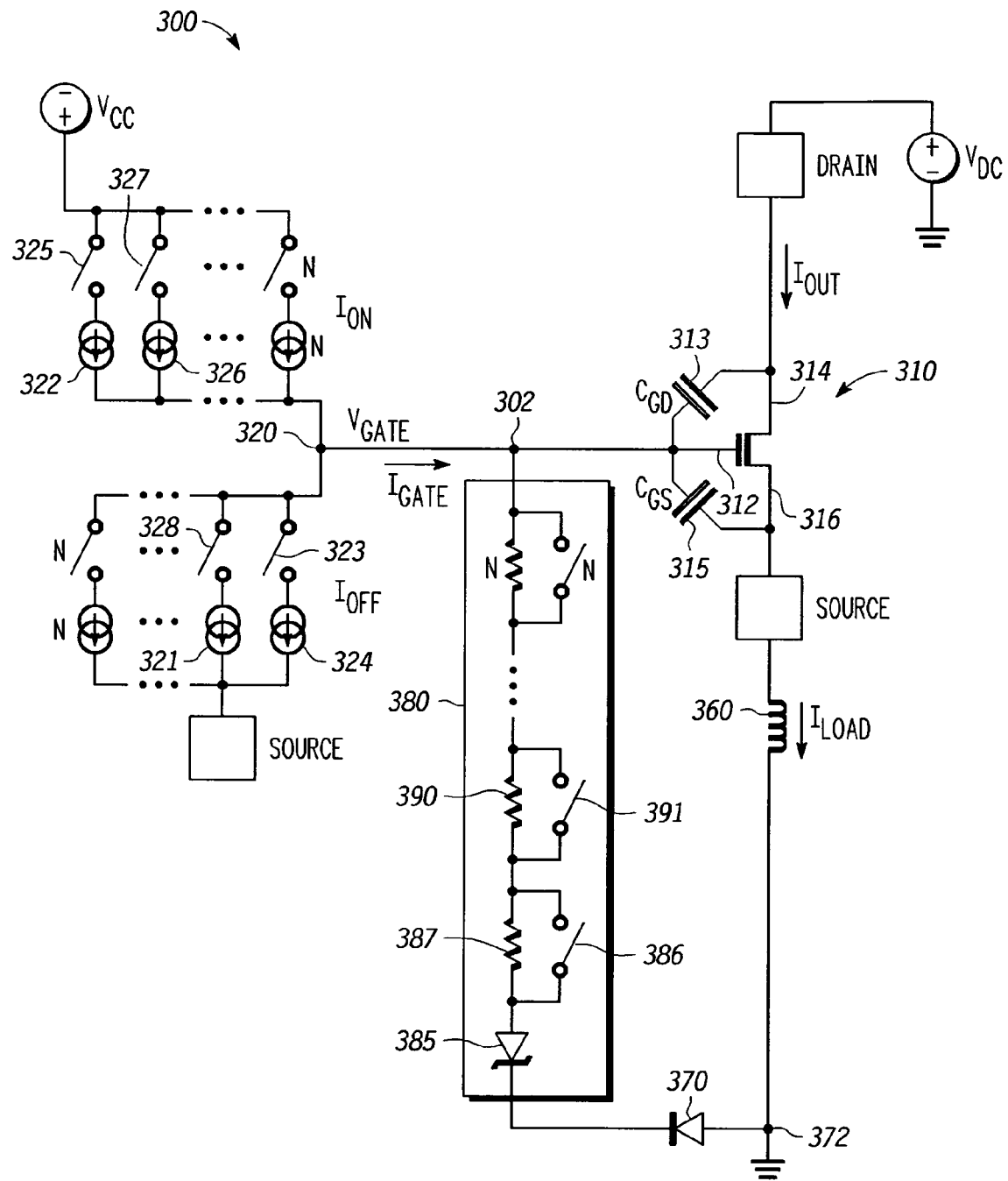
FIG. 3C is a diagram of one embodiment of the power switch of FIG. 3A including an adjustable slew rate.

FIG. 3C is a diagram of one embodiment of power switch 300 including an adjustable slew rate. In accordance with one exemplary embodiment, power switch 300 further comprises at least one additional current source 326 coupled in parallel with current source 322. Furthermore, a current source switch 327 is coupled to current source 326 such that when switch 327 is "on," additional current supplied from current supply 326 may be provided to transistor 310, and when "off," additional current is not supplied to transistor 310. Furthermore, a current source switch 325 is coupled to current source 322 such that when switch 325 is "on," current supplied from current supply 322 may be switched on/off similar to switch 327. As such, switches 325 and 327 may each be any device known in the art or developed in the future capable of performing such switching functions. As illustrated in FIG. 3C, according to another embodiment, there can be up to N additional current sources and current source switches in parallel with current source 322 and current source switch 325, where N is an integer number selected according to the requirements of a given power switch implementation.

In addition, power switch 300 further comprises at least one additional current source 321 coupled in parallel with current source 324. In addition, each of current sources 321 and 324 includes a current source switch 328 and 323, respectively, coupled to it. In one exemplary embodiment, current source 324 is substantially the same size as current source 322, and current source 321 is substantially the same size as current source 326 such that transistor 310 may be properly switched off by current source 324 and/or 321 (utilizing switch 328 and/or 323, respectively) when current is supplied by current source 322 and/or 326 (utilizing switch 325 and/or 327, respectively), respectively. In other words, $I_{on}$ and $I_{off}$ are substantially the same amount of current. Notably, switches 328 and 323 may each be any device known in the art or developed in the future capable of performing such switching functions. Furthermore, as illustrated in FIG. 3C, according to another embodiment, there can be up to N additional current sources and current source switches in parallel with current source 324 and current source switch 323, where N is an integer number selected according to the requirements of a given power switch implementation.

Furthermore, clamp 380 comprises at least one additional resistive element 390 coupled in series with zener diode 385 and resistive element 387. Furthermore, a resistive element switch 386 and a resistive element switch 391 are coupled around resistive elements 387 and 390, respectively, such that when switch 386 is switched "on," current bypasses resistive element 387 and when switch 386 is switched "off," current flows through resistive element 387. Similarly, when switch 391 is switched "on," current bypasses resistive element 390 and when switch 391 is switched "off," current flows through resistive element 390. Accordingly, when additional current is supplied by current source 326 (i.e., when switch 327 is "on"), and switches 386 and 391 are "on," power switch 300 can have a different slew rate than the embodiment illustrated above in FIG. 3A. As such, switches 386 and 391 may each be any device known in the art or developed in the future capable of performing such switching functions. Furthermore, as illustrated in FIG. 3C, according to another embodiment, there can be up to N additional resistive elements (and corresponding resistive element switches) coupled in series with zener diode 385, where N is an integer number selected according to the requirements of a given power switch implementation.

Accordingly, power switch 300, in various embodiments, may include any number of additional current sources (and current source switches) of any size to provide any desired amount of current to transistor 310 (and properly switch off transistor 310), and may also include any number of additional resistive elements (and resistive element switches) to provide any amount of resistance to clamp 380 such that power switch 300 may include any number of desired slew rates. In accordance with one exemplary embodiment, power switch 300 includes three current sources and current source switches (i.e., $I_{on}$), three additional current sources and current source switches (i.e., $I_{off}$), and three resistive elements and resistive element switches such that power switch 300 includes, for example, a slow, a medium, and a fast slew rate.

Figure 4:
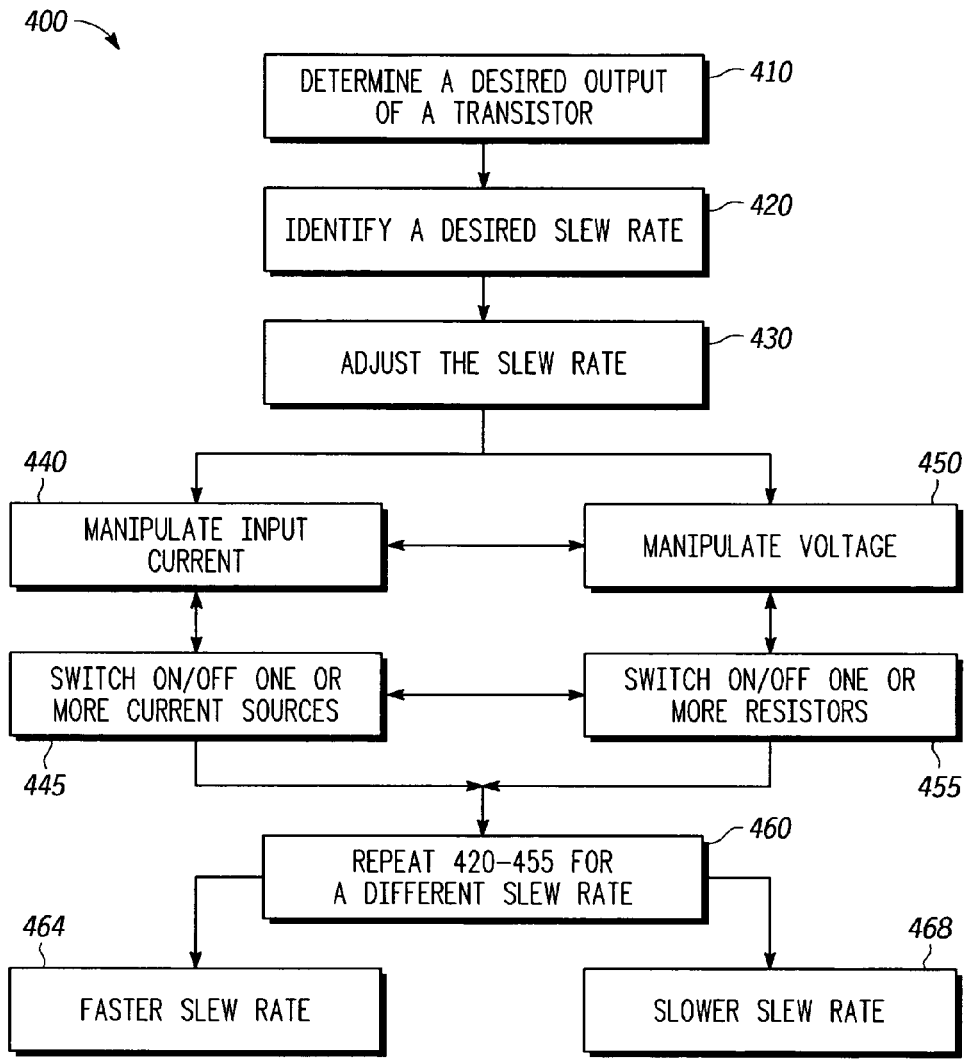
FIG. 4 is a flow diagram of a method to reduce conducted or radiated emissions in a power switch.

FIG. 4 is a flow diagram of a method 400 to reduce conducted or radiated emissions in, for example, a power switch (e.g., power switches 200 or 300). In accordance with one exemplary embodiment, method 400 initiates by determining a desired output of a transistor (e.g., transistors 210 or 310) of the power switch (block 410), and identifying a desired slew rate for the power switch (block 420).

Next, method 400 includes adjusting the slew rate of the power switch (block 430). In one exemplary embodiment, adjusting the slew rate comprises manipulating the input current to the transistor from one or more current sources (e.g., current sources 224, 226, 324, or 326) (block 440) and/or manipulating a voltage of a clamp (e.g., clamps 250 or 380) coupled to the transistor (block 450), wherein manipulating the input current comprises switching on or off one or more current sources to increase or decrease the amount of current supplied to the transistor (block 445), and manipulating the voltage includes switching on or off one or more resistive elements in the clamp to increase or decrease the amount of voltage in the clamp (block 455).

In addition, method 400 includes repeating blocks 420 through 455 for a different slew rate (block 460). In one exemplary embodiment, the different slew rate is a faster slew rate (block 464), whereas in another embodiment the different slew rate is a slower slew rate (block 468).

In summary, apparatus to modify a slew rate during inductive flyback is disclosed. In one embodiment, the apparatus comprises a transistor including a gate, a source, and a drain, wherein an inductive load is coupled to the drain. Furthermore, the apparatus includes a plurality of current sources coupled to the gate, wherein a first current source switches on the transistor, and a second current source switches off the transistor. In addition, the apparatus includes a clamp coupled to the gate and to the drain, the clamp comprising a first resistive element to increase a voltage of the clamp when current flows through the clamp, wherein the increased voltage causes the apparatus to include a different slew rate.

In accordance with one embodiment, the clamp comprises a first zener diode and the first zener diode is coupled in series with the first resistive element. In another embodiment, the clamp includes a pre-determined voltage to decrease the slew rate of the apparatus. In yet another embodiment, the pre-determined voltage is determined by at least one of a pre-determined voltage of the at least one zener diode, a pre-determined current of the first current source multiplied by a pre-determined resistance of the first resistive element, and a pre-determined voltage across the gate and source. Moreover, the pre-determined resistance, in an exemplary embodiment, is determined by at least one of a desired voltage output of the transistor and a desired gate pull down current. The clamp, in another embodiment of the apparatus, further comprises a second zener diode coupled in parallel with the first resistive element.

The apparatus, in another exemplary embodiment, further comprises a third current source coupled to the gate and coupled in parallel with the first current source, and a first switch coupled between the third current source and the gate, wherein the first switch switches on/off the third current source. In yet another embodiment, the clamp further comprises a second resistive element coupled in series with the first resistive element, and a second switch coupled to the clamp, wherein a first side of the second switch of coupled on one side of the second resistive element and a second side of the second switch is coupled to an opposite side of the second resistive element such that when the second switch is open current does not flow through the second resistive element and when the second switch is closed current flows through the second resistive element.

In addition, the disclosure also discusses a second apparatus to modify a slew rate during inductive flyback. In one embodiment, the second apparatus comprises a transistor including a gate, a source, and a drain, wherein an inductive load is coupled to the source. In one embodiment, the apparatus includes a plurality of current sources coupled to the gate, wherein a first current source switches on the transistor and a second current source switches off the transistor. In addition, the apparatus includes a clamp coupled to the gate and to ground, the clamp comprising a first resistive element to increase a voltage of the clamp when current flows through the clamp, wherein the increased voltage causes the apparatus to include a different slew rate.

In accordance with one embodiment, the clamp comprises a first zener diode and the first zener diode is coupled in series with the first resistive element. In another embodiment, the clamp includes a pre-determined voltage to decrease the slew rate of the apparatus. In yet another embodiment, the pre-determined voltage is determined by at least one of a pre-determined voltage of the at least one zener diode, a pre-determined current of the first current source multiplied by a pre-determined resistance of the first resistive element, and a pre-determined voltage across the gate and source. Moreover, the pre-determined resistance, in an exemplary embodiment, is determined by at least one of a desired voltage output of the transistor and a desired gate pull down current. The clamp, in another embodiment of the apparatus, further comprises a second zener diode coupled in parallel with the first resistive element.

The apparatus, in another exemplary embodiment, further comprises a third current source coupled to the gate and coupled in parallel with the first current source, and a first switch coupled between the third current source and the gate, wherein the first switch switches on/off the third current source. In yet another embodiment, the clamp further comprises a second resistive element coupled in series with the first resistive element, and a second switch coupled to the clamp, wherein a first side of the second switch of coupled on one side of the second resistive element and a second side of the second switch is coupled to an opposite side of the second resistive element such that when the second switch is open current does not flow through the second resistive element and when the second switch is closed current flows through the second resistive element.

In addition, the disclosure discusses a method to modify a slew rate during inductive flyback. In one embodiment, the method comprises identifying a desired slew rate for a power transistor, the power transistor comprising a transistor and at least one current source to provide an amount of input current to the transistor, an inductive load, and a clamp coupled to the transistor, wherein the clamp includes at least one zener diode coupled in series with at least one resistive element, and adjusting a voltage of the clamp to attain the desired slew rate. In accordance with one exemplary embodiment, adjusting the voltage comprises one of adding resistance to the clamp and subtracting resistance from the clamp.

In another exemplary embodiment, the method further comprises adjusting the amount of input current provided to the transistor. In accordance with one embodiment, adjusting the amount of input current comprises one of adding and subtracting input current from at least one additional current source.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

We claim:

1. An apparatus featuring inductive flyback slew rate modification, comprising:
   a transistor including a gate, a source, and a drain;
   an inductive load coupled to the drain;
   a plurality of current sources coupled to the gate, wherein a first current source of the plurality of current sources is configurable for switching the transistor ON and a second current source of the plurality of current sources is configurable for switching the transistor OFF; and
   a clamp coupled between the gate and the drain, wherein the clamp comprises a first resistive element configurable for increasing a voltage of the clamp in response to a current flow through the clamp, a first zener diode coupled in series with the first resistive element, and a second zener diode coupled in parallel with the first resistive element.

2. The apparatus of claim 1, wherein the clamp is configured for a pre-determined voltage to decrease the slew rate of the apparatus.

3. The apparatus of claim 2, wherein the pre-determined voltage is determined by at least one of a pre-determined voltage of the first zener diode, a pre-determined current of the first current source multiplied by a pre-determined resistance of the first resistive element, and a pre-determined voltage across the gate and source.

4. The apparatus of claim 3, wherein the pre-determined resistance is determined by at least one of a desired voltage output of the transistor and a desired gate pull down current.

5. The apparatus of claim 1, further comprising:
   a third current source coupled to the gate and coupled in parallel with the first current source;
   a first switch coupled between the third current source and the gate, wherein the first switch is configurable for connecting/disconnecting the third current source to the gate;
   a fourth current source coupled to the gate and coupled in parallel with the second current source; and
   a second switch coupled between the fourth current source, wherein the second switch is configurable for connecting/disconnecting the fourth current source to the gate.

6. The apparatus of claim 5, wherein the clamp further comprises:
   a second resistive element coupled in series with the first resistive element; and
   a third switch coupled to the clamp, wherein a first side of the third switch is coupled on one side of the second resistive element and a second side of the third switch is coupled to an opposite side of the second resistive element, wherein responsive to the third switch being in an closed state, current is prohibited from flowing through the second resistive element and wherein responsive to the third switch being in a open state, current is enabled to flow through the second resistive element.

7. An apparatus featuring inductive flyback slew rate modification, comprising:
   a transistor including a gate, a source, and a drain;
   an inductive load coupled to the source;
   a plurality of current sources coupled to the gate, wherein a first current source of the plurality of current sources is configurable for switching the transistor ON and a second current source of the plurality of current sources is configurable for switching the transistor OFF; and
   a clamp coupled between the gate and ground, wherein the clamp comprises a first resistive element configurable for increasing a voltage of the clamp in response to a current flow through the clamp, a first zener diode coupled in series with the first resistive element, and a second zener diode coupled in parallel with the first resistive element.

8. The apparatus of claim 7, wherein the clamp is configurable for a pre-determined voltage to decrease the slew rate of the apparatus.

9. The apparatus of claim 8, wherein the pre-determined voltage is determined by at least one of a pre-determined voltage of the first zener diode, a pre-determined current of the first current source multiplied by a pre-determined resistance of the first resistive element, and a pre-determined voltage across the gate and source.

10. The apparatus of claim 9, wherein the pre-determined resistance is determined by at least one of a desired voltage output of the transistor and a desired gate pull down current.

11. The apparatus of claim 7, further comprising:
    a third current source coupled to the gate and coupled in parallel with the first current source; and
    a first switch coupled between the third current source and the gate, wherein the first switch is configurable for connecting/disconnecting the third current source to the gate.

12. The apparatus of claim 11, wherein the clamp further comprises:
    a second resistive element coupled in series with the first resistive element; and
    a second switch coupled to the clamp, wherein a first side of the second switch is coupled on one side of the second resistive element and a second side of the second switch is coupled to an opposite side of the second resistive element, wherein responsive to the second switch being in an open state, current is prohibited from flowing through the second resistive element and wherein responsive to the second switch being in a closed state, current is enabled to flow through the second resistive element.

13. A method to reduce voltage transients during inductive flyback, the method comprising:
identifying a desired slew rate for a power transistor, the power transistor comprising:
a transistor and
at least one current source to provide an amount of input current to the transistor, an inductive load, and a clamp coupled to the transistor, wherein the clamp includes at least one zener diode coupled in series with at least one resistive element and at least one zener diode coupled in parallel with at least one resistive element; and
adjusting a voltage of the clamp to attain the desired slew rate.

14. The method of claim 13, wherein:
adjusting the voltage comprises one of adding resistance to the clamp and subtracting resistance from the clamp.

15. The method of claim 13, further comprising:
adjusting the amount of input current provided to the transistor.

16. The method of claim 15, wherein adjusting the amount of input current comprises one of adding and subtracting input current from at least one additional current source.

* * * * *